(12) United States Patent
Williams et al.

(10) Patent No.: US 12,349,530 B2
(45) Date of Patent: Jul. 1, 2025

(54) PHOTOVOLTAIC DEVICE

(71) Applicant: OXFORD PHOTOVOLTAICS LIMITED, Yarnton (GB)

(72) Inventors: Ben Williams, Yarnton (GB); Nicola Beaumont, Oxford (GB); Edward James William Crossland, Oxford (GB)

(73) Assignee: Oxford Photovoltaics Limited, Yarnton (GB)

( * ) Notice: Subject to any disclaimer, the term of this patent is extended or adjusted under 35 U.S.C. 154(b) by 115 days.

(21) Appl. No.: 17/611,616

(22) PCT Filed: May 14, 2020

(86) PCT No.: PCT/GB2020/051173
§ 371 (c)(1),
(2) Date: Nov. 16, 2021

(87) PCT Pub. No.: WO2020/229826
PCT Pub. Date: Nov. 19, 2020

(65) Prior Publication Data
US 2022/0246872 A1     Aug. 4, 2022

(30) Foreign Application Priority Data
May 16, 2019   (GB) ..................... 1906926

(51) Int. Cl.
*H10K 30/15*   (2023.01)
*H10K 30/40*   (2023.01)
(52) U.S. Cl.
CPC ............. *H10K 30/15* (2023.02); *H10K 30/40* (2023.02)
(58) Field of Classification Search
CPC ......... H10K 30/15; H10K 30/40; H10K 30/57
See application file for complete search history.

(56) References Cited

U.S. PATENT DOCUMENTS 9,416,279 B2   8/2016 Irwin et al.
2015/0243444 A1*  8/2015 Irwin .............. H10K 30/20
                                                            136/263

(Continued)

FOREIGN PATENT DOCUMENTS

CN      206758471 U  * 12/2017
JP      2014-067861 A     4/2014

(Continued)

OTHER PUBLICATIONS

Lei et al., Measurement of ZnO/Al2O3 Heterojunction Band Offsets by in situ X-Ray Photoelectron Spectroscopy, 2013 Chinese Phys. Lett. 30 118201. (Year: 2013).*

(Continued)

*Primary Examiner* — Andrew J Golden
(74) *Attorney, Agent, or Firm* — Meunier Carlin & Curfman LLC

(57) ABSTRACT

A photovoltaic device comprises a PIN structure in which a p-type hole transporting layer (2) is carried by a substrate (1) and a perovskite layer (3) and an n-type electron transporting layer (4) are arranged in sequence on the p-type layer. A light transmissive electrically conductive layer (9) is provided on top of the n-type electron transporting layer to form a light receiving top surface. Between the n-type electron transporting layer and the light transmissive conductive layer there is provided a structure comprising two inorganic electrically insulative layers (6, 8) having a layer of a conductive material (7) therebetween, wherein the two inorganic electrically insulative layers comprise a material having a band gap of greater than 4.5 eV and the layer of a conductive material comprises a material having a band gap of less than the band gap of the electrically insulative layers, wherein each electrically insulative layer forms a type-1 offset junction with the layer of conductive material.

13 Claims, 5 Drawing Sheets

(56) References Cited

U.S. PATENT DOCUMENTS

| | | | |
|---|---|---|---|
| 2017/0040560 A1* | 2/2017 | Martinson | H10K 30/88 |
| 2018/0166504 A1 | 6/2018 | Kamino | |
| 2018/0174762 A1* | 6/2018 | Kim | H10K 30/211 |
| 2018/0309077 A1 | 10/2018 | Bush et al. | |

FOREIGN PATENT DOCUMENTS

| | | |
|---|---|---|
| JP | 2018-503971 A | 2/2018 |
| KR | 20160046092 A | 4/2016 |
| KR | 20170036631 A | 4/2017 |
| WO | 2013171517 A1 | 11/2013 |
| WO | 2014045021 A1 | 3/2014 |
| WO | 2016005758 A1 | 1/2016 |
| WO | 2016198889 A1 | 12/2016 |
| WO | 2017089819 A1 | 6/2017 |
| WO | 2018007586 A1 | 1/2018 |
| WO | 2018057419 A1 | 3/2018 |

OTHER PUBLICATIONS

CN-206758471-U English machine translation (Year: 2017).*

Janowitz et al., Toward controlling the Al2O3/ZnO interface properties by in situ ALD preparation, Dalton Trans., 2022, 51, 9291. (Year: 2022).*

International Search Report and Written Opinion issued for Application No. PCT/GB2020/051173, dated Jul. 21, 2020.

Werner, Jérémie, Bjoern Niesen, and Christophe Ballif. "Perovskite/silicon tandem solar cells: Marriage of convenience or true love story?—An overview." Advanced Materials Interfaces 5.1 (2018): 1700731.

Search Report and Examination Report issued for Application No. GB1906926.9, dated Oct. 18, 2019.

Bush et al., "23.6%-effcient monolithic perovskite/silicon tandem solar cells with improved stability", Nature Energy 2, 17009 (2017) | DOI: 10.1038/nenergy.2017.9 | www.nature.com/natureenergy.

Hirade, Masaya, and Chihaya Adachi. "Small molecular organic photovoltaic cells with exciton blocking layer at anode interface for improved device performance." Applied Physics Letters 99.15 153302 (2011): 217.

Mahmood, Khalid, Saad Sarwar, and Muhammad Taqi Mehran. "Current status of electron transport layers in perovskite solar cells: materials and properties." Rsc Advances 7.28 (2017): 17044-17062.

Peumans, Peter, Aharon Yakimov, and Stephen R. Forrest. "Small molecular weight organic thin-film photodetectors and solar cells." Journal of Applied Physics 93.7 (2003): 3693-3723.

Angèle Reinders, Photovoltaic Solar Energy. From Fundamentals to Applications. 2017, 3.9, Martin Green Advanced Concepts. 160-166.

Sahli, Florent, et al. "Fully textured monolithic perovskite/silicon tandem solar cells with 25.2% power conversion efficiency." Nature materials 17.9 (2018): 820-826.

Vos, Martijn FJ, et al. "Atomic layer deposition of molybdenum oxide from (N t Bu) 2 (NMe2) 2Mo and O2 plasma." Journal of Vacuum Science & Technology A: Vacuum, Surfaces, and Films 34.1 (2016): 01A103.

V. Zardetto, B.L. Williams, et al. "Atomic layer deposition for perovskite solar cells: research status, opportunities and challenges", Sustainable Energy & Fuels, vol. 1, pp. 30-55 (2017).

Nam-Gyu Park et al., "Organic-Inorganic Halide Perovskite Photovoltaics: From Fundamentals to Device Architectures" Springer (2016) ISBN-13: 978-3319351124 366 pages.

Office Action issued by the Japanese Patent Office in connection with Japanese Application No. 2021-565922, 6 pages.

Kevin A. Bush, et al., "23.6%-Efficient Monolithic Perovskite/silicon Tandem Solar Cells with Improved Stability." Nature Energy 2, 4 (Feb. 2017), accessed via MIT Open Access Articles.

Office Action issued by the Korean Patent Office in connection with Korean Application No. 10-2021-7041368, dated Apr. 25, 2024, 16 pages.

English translation of Office Action issued on Aug. 6, 2024, in Japanese Patent Application No. 2021-565922.

Leontie et al. Structural and optical characteristics of bismuth oxide thin films. Surface Science 507-510 (2002) 480-485.

Neff et al. Structural, optical, and electronic properties of magnetron-sputtered platinum oxide films. J. Appl. Phys. 79 (10), May 15, 1996. American Institute of Physics. pp. 7672-7675.

Chiang et al. High mobility transparent thin-film transistors with amorphous zinc tin oxide channel layer. Applied Physics Letters 86, 013503 (2005).

Wang et al. Development of a nano-QSPR model to predict band gaps of spherical metal oxide nanoparticles. RSC Adv., 2019, 9, 8426-8434.

Diaz et al. Solid State Nanostructured Metal Oxides as Photocatalysts and Their Application in Pollutant Degradation: A Review. Photochem 2022, 2, 609-627. https://doi.org/10.3390/photochem2030041.

* cited by examiner

| *data from 20 vs. 20 1cm² devices | SnO₂ | Al₂O₃/SnO₂/Al₂O₃ |
|---|---|---|
| *n and $J_0$ obtained from single diode fit to dark J-V curves | | |
| Lowest $R_s$ (Ω.cm²) | 3.5 | 3.7 |
| Lowest n | 3.0 | 2.5 |
| Lowest $J_0$ (mA.cm⁻²) | $4 \cdot 10^{-8}$ | $1.8 \cdot 10^{-9}$ |
| $R_s$ range (Ω.cm²) | 3.5 - 15 | 3.7 - 10 |
| n range | 3.0 - 4.0 | 2.5 - 2.6 |
| $J_0$ range (mA.cm⁻²) | $10^{-8} - 10^{-6}$ | $1 \cdot 10^{-9} - 5 \cdot 10^{-9}$ |
| *obtained from reverse light J-V curves | | |
| Highest $V_{oc}$ | - | +20mV |
| Highest FF | - | +5.2% |
| $V_{oc}$ range | | +40mV |
| FF range | | +10% |

FIG. 3

Straddling type-1 offset on either side of Layer B

PHOTOVOLTAIC DEVICE

CROSS-REFERENCE TO RELATED APPLICATIONS

This application is a United States National Phase Patent Application of International Patent Application Number PCT/GB2020/051173, filed on May 14, 2020, which claims priority to GB Patent Application No. 1906926.9, filed on May 16, 2019, both of which are incorporated by reference herein in their entireties.

The present invention relates to photovoltaic (PV) devices, and particularly to perovskite PV devices and multi-junction photovoltaic devices such as tandem solar cells having a perovskite-based sub-cell.

Solar energy conversion is one of the most promising technologies to provide renewable energy. However, the high cost of manufacturing devices that capture solar energy, including high material costs, has historically hindered its widespread use.

Single junction solar cells—such as those made from silicon p-n junctions for example—have a maximum theoretical efficiency of about 29% under AM1.5G conditions (see for example the book "Photovoltaic Solar Energy—from Fundamentals to Applications", edited by A Reinders et al., Wiley ISBN9781118927465 [2017] on p 164) and practical efficiencies of up to 26%. However, if a cell of a material having a higher band gap is stacked on top of the silicon single junction cell (or other type of single junction cell) and connected in series, the limiting theoretical efficiency increases to above 40%. There is therefore much current interest in tandem and other multi-junction cell technologies.

In addition, single junction perovskite solar cells are exhibiting efficiencies to rival that of silicon.

Solar cells can have a typical or an inverted structure. For inverted perovskite solar cells such as those described herein, developed in the configuration often referred to as P-I-N (with layer sequence being p-type contact (P), perovskite (I), n-type contact (N)), it is typical to use an organic n-contact material. However, this organic material can become damaged during subsequent layering processes. This problem can be particularly acute when, for instance, the subsequent TCO (transparent conducting oxide electrode) layer is coated by sputtering onto the n-type contact. To protect the organic n-contact layer from sputter damage during sputtering of a subsequent layer of material, a denser n-type inorganic contact can be deposited immediately after the organic n-contact layer is deposited.

By way of example, the use of atomic layer deposition (ALD) grown n-type $SnO_2$ for electron selection and sputter protection of organic fullerene contact in inverted PIN perovskite solar cells has been published by Bush et al., 2017 (10.1038/nenergy.2017.9). Furthermore, a fully textured monolithic perovskite/silicon tandem solar cell is disclosed by Sahli et al in article published online on 11 Jun. 2018 in Nature Materials (https://doi.org/10.1038/s41563-018-0115-4). A buffer layer of $SnO_2$ was deposited onto the stack by atomic layer deposition.

A review of the use of ALD for perovskite solar cells has recently been published—see V. Zardetto, B. L. Williams, et al. Sustainable Energy & Fuels, vol 1, pp 30-55 (2017). Inverted PIN perovskite device structures are described in more detail in the textbook "Organic-Inorganic Halide Perovskite Photovoltaics" edited by Park, Gratzel and Miyasaka, Springer (2016) ISBN978-3-319-35112-4 (see especially Chapter 12—pp 307-324).

However, there are a number of potential drawbacks with the pre-existing technology, which include:

1) Process reproducibility: Due to the surface dependence of the nucleation of many ALD processes, film thickness can vary from run-to-run. For $SnO_2$, this can be up to 10-15%.

2) Carrier recombination at inorganic-n/fullerene interface due to unpassivated bonds can lead to open-circuit voltage ($V_{oc}$) and fill factor (FF) loss in solar cell devices.

3) The purpose of the inorganic n-type layer is to protect the organic n-type and perovskite layers from ITO sputter damage, as well as to prevent the formation of deleterious ITO/organic-n and ITO/perovskite contact regions. Insufficient density and/or surface coverage of the inorganic layer, or overly high conductivity can limit its effectiveness.

The present invention addresses these shortcomings with the prior art.

SUMMARY OF THE INVENTION

According to a first aspect of the present invention, there is provided a photovoltaic device as specified in claims 1 to 11.

Photovoltaic devices comprising multi-layered interfacial layers are known from U.S. Pat. No. 9,416,279. However, this patent discloses the typical NIP structure rather than the PIN structures of the present invention. The manufacturing process considerations facing NIP and PIN structures are different. Sputtering is typically less of a problem for the NIP structures, whereas the use of sputtering with PIN structures can damage the materials, as detailed above. The present invention concerns inverted perovskite solar cells, and provides an inorganic 'intrinsic-n-type-intrinsic (INI)' sandwich structure to replace the neat inorganic n-type layer of the prior art discussed above. When a single "neat" $SnO_2$ layer is used, there is greater variability and lower peak and average efficiency as compared to using the trilayer stack of the present invention.

The use of the interfacial trilayer structure of the present invention is advantageous over the use of a single $SnO_2$ layer for several reasons. The use of the first electrically insulating layer, for instance, $Al_2O_3$ in the stack enables more reproducible growth of the entire stack when ALD is used. ALD growth depends almost entirely on surface chemistry. The $Al_2O_3$ layer acts as a rapidly nucleating layer that functionalises the surface by creation of OH surface terminations, thereby assisting growth of the subsequent layer in the stack. Ultimately, the inclusion of the first layer reduces the run-to-run thickness variability.

The first (e.g. $Al_2O_3$) layer can also act to chemically passivate any free bonds that are present at the inorganic-n/organic-n interface, subsequently reducing the density of electronic traps available for carrier recombination, and therefore reducing the saturation current density, and diode ideality factor. This can act to increase both open-circuit voltage and fill factor.

Finally, materials such as $Al_2O_3$ can act as reservoirs for free radicals. The additional protection from sputter damage and prevention of ITO/organic-n, or ITO/perovskite defect interfaces can reduce parasitic shunt pathways and/or the formation of weak diode regions.

According to a second aspect of the present invention there is provided a method of making a photovoltaic device as specified in any one of claims 1 to 11, in which the two inorganic electrically insulative layers and the layer of conductive material therebetween are deposited in sequence onto the layer of n-type electron transporting material by atomic layer deposition. Such deposition is preferably performed at a temperature of less than or equal to 125° C.

BRIEF DESCRIPTION OF THE DRAWINGS

Embodiments of the invention will now be described, by way of example only, with reference to the accompanying schematic drawings, in which:

FIG. 3 is a table listing the best values and associated range (from 20 single-junction perovskite devices for each device type) of series resistance, ideality factor and reverse saturation current, as extracted by fitting a one diode model to the dark current-voltage data. The gains in $V_{oc}$ and FF obtained by using the tri-layer in place of $SnO_2$-only, as measured from light current-voltage data, are also shown;

DETAILED DESCRIPTION OF THE INVENTION

In one embodiment, the photovoltaic device comprises a PIN structure in which a p-type hole transporting layer is disposed on (or carried by) a substrate, and an perovskite layer and an n-type electron transporting layer are arranged in sequence on the p-type layer, and a light transmissive electrically conductive layer is provided on top of the n-type electron transporting layer to form a light receiving top surface, characterised in that between the n-type electron transporting layer and the light transmissive conductive layer there is provided an interfacial structure comprising two inorganic electrically insulative layers having a layer of a conductive material therebetween, wherein the two inorganic electrically insulative layers comprise a material having a band gap of greater than 4.5 eV and the layer of a conductive material comprises a material having a band gap of less than that of the electrically insulative layers (for example less than or equal to 4.0 eV and greater than 2 eV).

The substrate advantageously comprises a further photovoltaic sub-cell to form a monolithically integrated multi-junction photovoltaic device. This further photovoltaic sub-cell may comprise, for example, a further perovskite, monocrystalline silicon, polysilicon, $Cu(In,Ga)Se_2$ or $Cu_2ZnSn(S,Se)_4$ sub-cell.

Advantageously, the photovoltaic device is a monolithically integrated solar cell in which the further sub-cell comprises a layer of a perovskite material.

Preferably, the perovskite material is ambipolar. Typically it has a three-dimensional crystal structure having the formula $ABX_3$, wherein A comprises one or more organic or inorganic cations (such as for example methylammonium, formamidinium, guanidinium etc., and caesium, rubidium, etc. cations), B represents a divalent metal selected from one or more of the group consisting of Pb, Sn, Sb, or Ti, and X represents one or more halide anions selected, for example, from Cl, Br and I.

In another embodiment, there is provided a photovoltaic device comprising a $Cu(In,Ga)Se_2$ or $Cu_2ZnSn(S,Se)_4$ p-n junction comprising a p type layer and an n-type layer, and a light transmissive electrically conductive layer provided on top of the n-type layer to form a light receiving top surface, characterised in that between the n-type layer and the light transmissive conductive layer there is provided a structure comprising two inorganic electrically insulative layers having a layer of a conductive material therebetween, wherein the two inorganic electrically insulative layers comprise a material having a band gap of greater than that of the conductive material (for example greater than 4.5 eV) and the layer of a conductive material comprises a material having a band gap of less than that of the electrically insulative layers (for example less than 4.0 eV) and greater than 2 eV.

Figure 1:
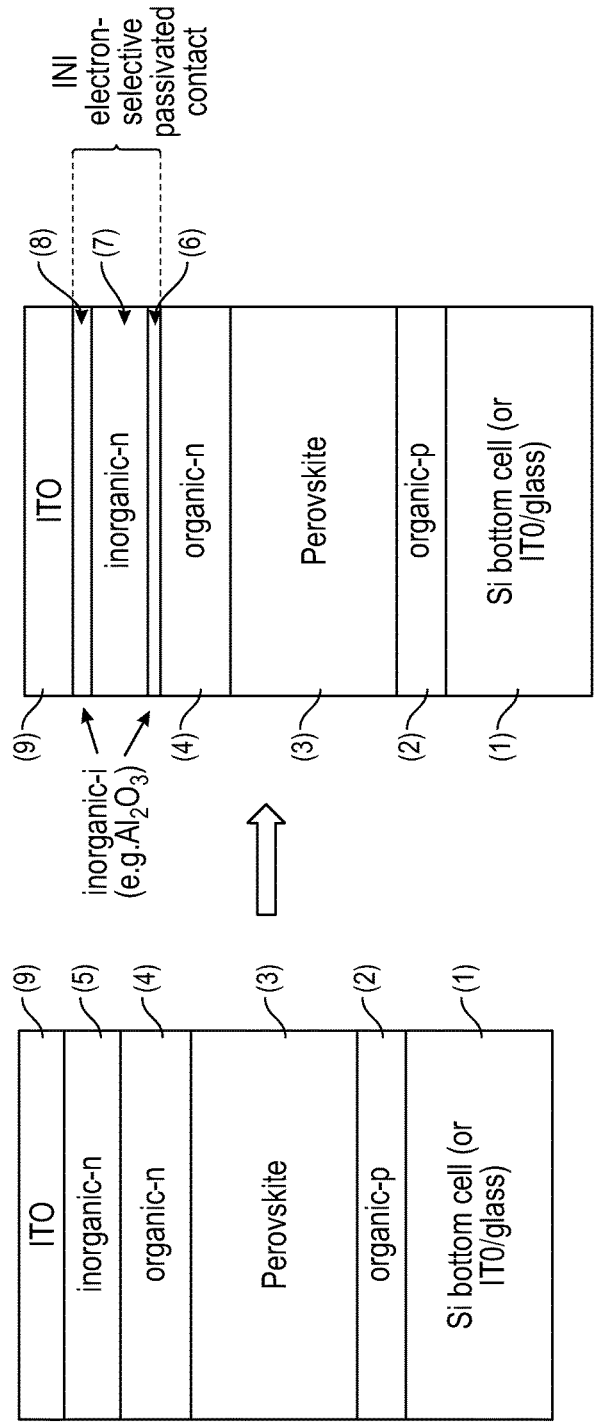
FIG. 1A illustrates in cross-section a known photovoltaic device.
FIG. 1B illustrates in cross-section an exemplary device according to the present invention.

FIG. 1A shows a prior art device stack in schematic cross-section, whilst FIG. 1B shows a schematic cross-section of a photovoltaic device according to the present invention. The substrate on the bottom of each stack (1) comprises a material such as glass having a TCO layer such as ITO on top, or a bottom sub-cell such as a silicon solar cell. Perovskite/silicon tandem solar cells are described more fully in, for example, Werner et al. Adv. Mater. Interfaces 5, 1700731 (2017).

FIG. 1B shows an exemplary embodiment according to the present invention. As can be seen, the bottom of the stack (1) comprises a Si bottom cell or ITO/glass. This is then covered by a p-type layer (2), which in turn is covered by a perovskite layer (3). The perovskite layer is covered by an organic n-type layer (4). The top of the stack is formed from an ITO layer (9). Inbetween the ITO layer and the organic n-type layer exists the inventive trilayer interfacial structure of the invention (6,7,8).

The p-type layer (2) comprises a hole transporting material, which may be inorganic or organic. On top of the p-type layer is a perovskite layer (3) having a three-dimensional crystal structure, such as for example, $MAPbI_3$ or $FA_{0.8}$:$Cs_{0.2}PbI_2Br$. The composition of the perovskite layer can be chosen appropriately for the desired band-gap of the photoactive layer.

The p-type layer is a layer of a hole-transporting (i.e. a p-type) material. The p-type material may be a single p-type compound or elemental material, or a mixture of two or more p-type compounds or elemental materials, which may be undoped or doped with one or more dopant elements.

The p-type layer may comprise an inorganic or an organic p-type material. Typically, the p-type region comprises a layer of an organic p-type material.

Suitable p-type materials may be selected from polymeric or molecular hole transporters. The p-type layer employed in the photovoltaic device of the invention may for instance comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b]dithiophene-2,6-diyl]]), PVK (poly(N-vinylcarbazole)), HTM-TFSI (1-hexyl-3-methylimidazolium bis(trifluoromethylsulfonyl)imide), Li-TFSI (lithium bis(trifluoromethanesulfonyl)imide) or tBP (tert-butylpyridine). The p-type region may comprise carbon nanotubes. Usually, the p-type material is selected from spiro-OMeTAD, P3HT, PCPDTBT and PVK. Preferably, the p-type region consists of a p-type layer that comprises spiro-MeOTAD.

The p-type layer may for example comprise spiro-OMeTAD (2,2',7,7'-tetrakis-(N,N-di-p-methoxyphenylamine)9,9'-spirobifluorene)), P3HT (poly(3-hexylthiophene)), PCPDTBT (Poly[2,1,3-benzothiadiazole-4,7-diyl[4,4-bis(2-ethylhexyl)-4H-cyclopenta[2,1-b:3,4-b']dithiophene-2,6-diyl]]), or PVK (poly(N-vinylcarbazole)).

Suitable p-type materials also include molecular hole transporters, polymeric hole transporters and copolymer hole transporters. The p-type material may for instance be a molecular hole transporting material, a polymer or copolymer comprising one or more of the following moieties: thiophenyl, phenelenyl, dithiazolyl, benzothiazolyl, diketopyrrolopyrrolyl, ethoxydithiophenyl, amino, triphenyl amino, carbozolyl, ethylene dioxythiophenyl, dioxythiophenyl, or fluorenyl. Thus, a p-type layer employed in the photovoltaic device of the invention may for instance comprise any of the aforementioned molecular hole transporting materials, polymers or copolymers.

Suitable p-type materials also include m-MTDATA (4,4',4"-tris(methylphenylphenylamino)triphenylamine), MeOTPD (N,N,N',N'-tetrakis(4-methoxyphenyl)-benzidine), BP2T (5,5'-di(biphenyl-4-yl)-2,2'-bithiophene), Di-NPB (N,N'-Di-[(1-naphthyl)-N,N'-diphenyl]-1,1'-biphenyl)-4,4'-diamine), α-NPB (N,N'-di(naphthalen-1-yl)-N,N'-diphenyl-benzidine), TNATA (4,4',4"-tris-(N-(naphthylen-2-yl)-N-phenylamine)triphenylamine), BPAPF (9,9-bis[4-(N,N-bis-biphenyl-4-yl-amino)phenyl]-9H-fluorene), spiro-NPB (N2,N7-Di-1-naphthalenyl-N2,N7-diphenyl-9,9'-spirobi[9H-fluorene]-2,7-diamine), 4P-TPD (4,4-bis-(N,N-diphenylamino)-tetraphenyl), PEDOT:PSS and spiro-OMeTAD.

The p-type layer may be doped, for instance with tertbutyl pyridine and LiTFSI. A p-type layer may be doped to increase the hole-density. A p-type layer may for instance be doped with NOBF$_4$ (Nitrosonium tetrafluoroborate), to increase the hole-density.

In other examples, the p-type layer may comprise an inorganic hole transporter. For instance, the p-type layer may comprise an inorganic hole transporter comprising an oxide of vanadium, copper, nickel or molybdenum; CuI, CuBr, CuSCN, Cu$_2$O, CuO or CIS; a perovskite; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped. The p-type layer may be a compact layer of said inorganic hole transporter which is not porous.

The p-type layer may for instance comprise an inorganic hole transporter comprising an oxide of nickel, vanadium, copper or molybdenum; CuI, CuBr, CuSCN, Cu$_2$O, CuO or CIS; amorphous Si; a p-type group IV semiconductor, a p-type group III-V semiconductor, a p-type group II-VI semiconductor, a p-type group I-VII semiconductor, a p-type group IV-VI semiconductor, a p-type group V-VI semiconductor, and a p-type group II-V semiconductor, which inorganic material may be doped or undoped.

The p-type region may, for example, have a thickness of from 5 nm to 1000 nm. For instance, the p-type region may have a thickness of from 50 nm to 500 nm, or from 100 nm to 500 nm. In the above described multi-junction photovoltaic devices, the p-type region 112 of the first sub-cell preferably has a thickness from 10 nm to 50 nm, and more preferably of approximately 20 nm. The p-type region could also comprise a bi-layer or multilayer structure consisting of 2 or more layers having different materials.

The perovskite material may have general formula (I):

$$[A][B][X]_3 \quad (I)$$

wherein [A] is one or more monovalent cations, [B] is one or more divalent inorganic cations, and [X] is one or more halide anions, preferably comprises one or more halide anions selected from fluoride, chloride, bromide, and iodide, and preferably selected from chloride, bromide and iodide. More preferably [X] comprises one or more halide anions selected from bromide and iodide. In some examples, [X] preferably comprises two different halide anions selected from fluoride, chloride, bromide, and iodide, and preferably selected from chloride, bromide and iodide, and more preferably comprises bromide and iodide.

[A] preferably comprises one or more organic cations selected from methylammonium ($CH_3NH_3^+$), formamidinium ($HC(NH_2)_2^+$), and ethyl ammonium ($CH_3CH_2NH_3^+$), and preferably comprises one organic cation selected from methylammonium ($CH_3NH_3^+$) and formamidinium ($HC(NH_2)_2^+$). [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$.

[B] preferably comprises at least one divalent inorganic cation selected from $Pb^{2+}$ and $Sn^{2+}$, and preferably comprises $Pb^{2+}$.

In preferred examples, the perovskite material has the general formula:

$$A_xA'_{1-x}B(X_yX'_{1-y})_3 \quad (IA)$$

wherein A is formamidinium (FA), A' is a caesium cation ($Cs^+$), B is $Pb^{2+}$, X is iodide and X' is bromide, and wherein $0<x\leq1$ and $0<y\leq1$. In these preferred embodiments, the perovskite material can therefore comprise a mixture of two monovalent cations. In addition, in the preferred embodiments, the perovskite material can therefore comprise either a single iodide anion or a mixture of iodide and bromide anions. The present inventors have found such perovskite materials can have band gaps in from 1.50 eV to 1.75 eV and that layers of such perovskite materials can be readily formed with suitable crystalline morphologies and phases. More preferably, the perovskite material is $FA_{1-x}Cs_xPbI_{3-y}Br_y$.

In order to provide highly efficient photovoltaic devices, the absorption of the absorber should ideally be maximised so as to generate an optimal amount of current. Consequently, when using a perovskite as the absorber in a photovoltaic device or sub-cell, the thickness of the perovskite layer should ideally be in the order of from 300 to 600 nm, in order to absorb most of the sun light across the visible spectrum. Typically, therefore, the thickness of the layer of the perovskite material is greater than 100 nm. The thickness of the layer of the perovskite material in the photovoltaic device may for instance be from 100 nm to 1000 nm. The thickness of the layer of the perovskite material in the photovoltaic device may for instance be from 200 nm to 700 nm, and is preferably from 300 nm to 600 nm. In the above described multi-junction photovoltaic devices, the planar layer of perovskite material 11 in the photoactive region of the first/top sub-cell 210 preferably has a thickness from 350 nm to 450 nm, and more preferably of approximately 400 nm.

The perovskite layer may be prepared as described in WO2013/171517, WO2014/045021, WO2016/198889, WO2016/005758, WO2017/089819, and in the reference books "Photovoltaic Solar Energy: From Fundamentals to Applications" edited by Angèle Reinders and Pierre Verlinden, Wiley-Blackwell (2017) ISBN-13: 978-1118927465 and "Organic-Inorganic Halide Perovskite Photovoltaics:

From Fundamentals to Device Architectures" edited by Nam-Gyu Park et al., Springer (2016) ISBN-13: 978-3319351124.

On top of this perovskite layer is a layer of an electron transporting material (4). Electron transporting layers suitable for use in perovskite photovoltaic cells in the present embodiments have recently been described in the review paper "Current status of electron transport layers in perovskite solar cells: materials and properties", Mahmood, Sarwar and Mehran, RSC Adv. 2017.7.17044.

The electron transporting layers typically comprise n-type regions. In the above described multi-junction photovoltaic device, the n-type region of the first sub-cell comprises one or more n-type layers. Often, the n-type region is an n-type layer, i.e. a single n-type layer. In other examples, however, the n-type region may comprise an n-type layer and a separate n-type exciton blocking layer or hole blocking layer.

An exciton blocking layer is a material which is of wider band gap than the photoactive material, but has either its conduction band or valance band closely matched with those of the photoactive material. If the conduction band (or lowest unoccupied molecular orbital energy levels) of the exciton blocking layer are closely aligned with the conduction band of the photoactive material, then electrons can pass from the photoactive material into and through the exciton blocking layer, or through the exciton blocking layer and into the photoactive material, and we term this an n-type exciton blocking layer. An example of such is bathocuproine (BCP), as described in P. Peumans, A. Yakimov, and S. R. Forrest, "Small molecular weight organic thin-film photodetectors and solar cells" J. Appl. Phys. 93, 3693 (2001) and Masaya Hirade, and Chihaya Adachi, "Small molecular organic photovoltaic cells with exciton blocking layer at anode interface for improved device performance" Appl. Phys. Lett. 99, 153302 (2011).

The n-type layer (4) is a layer of an electron-transporting (i.e. an n-type) material. The n-type material may be a single n-type compound or elemental material, or a mixture of two or more n-type compounds or elemental materials, which may be undoped or doped with one or more dopant elements.

The electron transporting material employed may comprise an inorganic or an organic n-type material.

A suitable inorganic n-type material may be selected from a metal oxide, a metal sulphide, a metal selenide, a metal telluride, a perovskite, amorphous or nanocrystalline Si, an n-type group IV semiconductor, an n-type group III-V semiconductor, an n-type group II-VI semiconductor, an n-type group I-VII semiconductor, an n-type group IV-VI semiconductor, an n-type group V-VI semiconductor, and an n-type group II-V semiconductor, any of which may be doped or undoped.

More typically, the n-type material is selected from a metal oxide, a metal sulphide, a metal selenide, and a metal telluride.

Thus, an n-type layer may comprise an inorganic material selected from oxide of titanium, tin, zinc, niobium, tantalum, tungsten, indium, gallium, neodymium, palladium, or cadmium, or an oxide of a mixture of two or more of said metals. For instance, an n-type layer may comprise $TiO_2$, $SnO_2$, $ZnO$, $Nb_2O_5$, $Ta_2O_5$, $WO_3$, $W_2O_5$, $In_2O_3$, $Ga_2O_3$, $Nd_2O_3$, $PbO$, or $CdO$.

Other suitable n-type materials that may be employed include sulphides of cadmium, tin, copper, or zinc, including sulphides of a mixture of two or more of said metals. For instance, the sulphide may be $FeS_2$, $CdS$, $ZnS$, $SnS$, $BiS$, $SbS$, or $Cu_2ZnSnS_4$.

An n-type layer may for instance comprise a selenide of cadmium, zinc, indium, or gallium or a selenide of a mixture of two or more of said metals; or a telluride of cadmium, zinc, cadmium or tin, or a telluride of a mixture of two or more of said metals. For instance, the selenide may be $Cu(In,Ga)Se_2$. Typically, the telluride is a telluride of cadmium, zinc, cadmium or tin. For instance, the telluride may be $CdTe$.

An n-type layer may for instance comprise an inorganic material selected from oxide of titanium, tin, zinc, niobium, tantalum, tungsten, indium, gallium, neodymium, palladium, cadmium, or an oxide of a mixture of two or more of said metals; a sulphide of cadmium, tin, copper, zinc or a sulphide of a mixture of two or more of said metals; a selenide of cadmium, zinc, indium, gallium or a selenide of a mixture of two or more of said metals; or a telluride of cadmium, zinc, cadmium or tin, or a telluride of a mixture of two or more of said metals.

Examples of other semiconductors that may be suitable n-type materials, for instance if they are n-doped, include group IV elemental or compound semiconductors; amorphous Si; group III-V semiconductors (e.g. gallium arsenide); group II-VI semiconductors (e.g. cadmium selenide); group I-VII semiconductors (e.g. cuprous chloride); group IV-VI semiconductors (e.g. lead selenide); group V-VI semiconductors (e.g. bismuth telluride); and group II-V semiconductors (e.g. cadmium arsenide).

When an n-type layer is an inorganic material, for instance $TiO_2$ or any of the other materials listed above, it may advantageously be a compact layer of said inorganic material. Preferably the n-type layer is a compact layer of $TiO_2$.

Other n-type materials may also be employed, including organic and polymeric electron-transporting materials, and electrolytes. Suitable examples include, but are not limited to a fullerene or a fullerene derivative, an organic electron transporting material comprising perylene or a derivative thereof, or poly{[N,N0-bis(2-octyldodecyl)-naphthalene-1, 4,5,8-bis(dicarboximide)-2,6-diyl]-alt-5,50-(2,20-bithiophene)} (P(NDI2OD-T2)). For example, the n-type region may comprise a n-type layer comprising one or more of C60, C70, C84, C60-PCBM, C70-PCBM, C84-PCBM and carbon nanotubes. It may comprise C60-IPB, C60-IPH, C70-IPB, C70IPH or mixtures thereof. Such materials are commercially available from Solenne BV, Zernikepark 6, 9747AN Groningen, The Netherlands.

The n-type region may have a thickness of from 3 nm to 1000 nm. Where the n-type region comprises a compact layer of an n-type semiconductor, the compact layer has a thickness of from 3 nm to 200 nm.

The interfacial structure (6,7,8) of this invention comprises a conductive material (7) sandwiched between two electrically insulating layers (6,8). The two electrically insulating layers comprise a material having an appropriate band gap of greater than 4.5 eV. Each electrically insulating layer need not comprise the same material, although preferably, both layers do comprise the same material. A wide band gap is important. The material provides passivation of band gap states introduced by the n-type region below and the electrically conductive layer (e.g. $SnO_2$) above.

One example of an interfacial structure according to the invention is shown in FIG. 1B, onto the n-type layer (4) is deposited the two inorganic electrically insulative layers (6, 8) which comprise a material having a band gap of greater than 4.5 eV and the layer of a conductive material (7) therebetween, which preferably comprises a material having a band gap of less than 4.0 eV and greater than 2 eV. The electrically insulating layers are preferably deposited by Atomic Layer Deposition (ALD).

Figure 5:
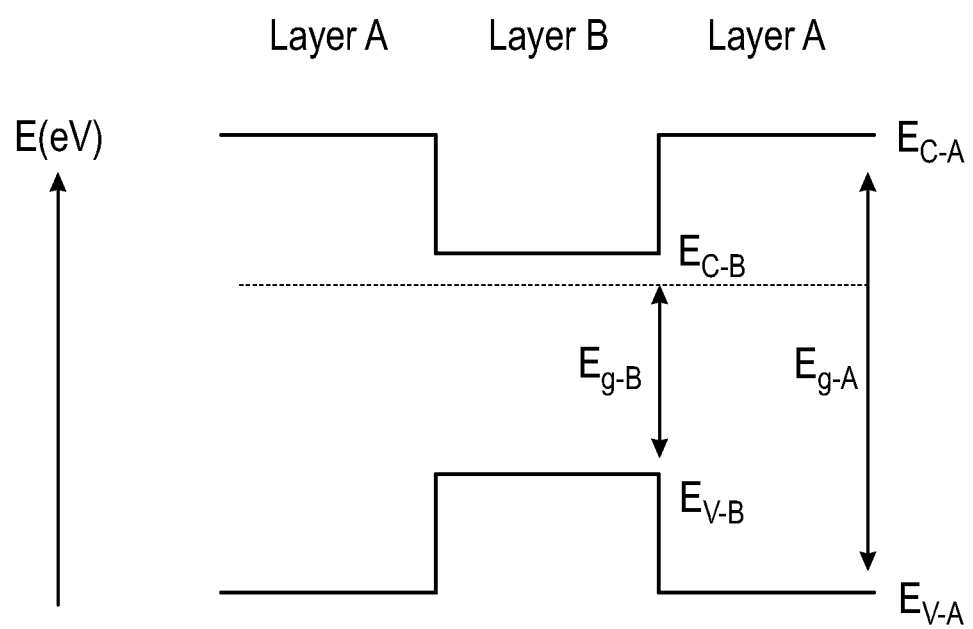
FIG. 5 is an energy level diagram showing a straddling type-1 offset junction.

The layer of conductive material forms a straddling type-1 offset junction with each electrically insulating layer, as illustrated in FIG. 5. In this diagram:

$E_{g\text{-}A} > W_{g\text{-}B}$ $E_{C\text{-}A} > E_{C\text{-}B}$ $E_{V\text{-}A} < E_{V\text{-}B}$ The electrically insulating layers (6,8) are formed from a material comprising a band gap of greater than 4.5 eV, preferably greater than 5, 5.5, 6, 6.5 or 7 eV. Suitable materials include $Al_2O_3$ and LiF. The most preferred material is $Al_2O_3$.

The electrically insulating layers form a conduction band and valence band barrier at the interface with the adjacent layers, producing a type-1 heterojunction in these locations.

Each layer of electrically insulating material preferably has a thickness in the range 0.1-10 nm, preferably 0.4-3 nm and most preferably around 1 nm thick.

Electrically conductive layer 7 is formed from a material having a band gap which is less than the bang gap of the material of the electrically insulating layers (6, 8). Where each conductive layer is made from a different material, the electrically conductive layer is formed from a material having a band gap of less than both materials. Preferably, it is less than 4.0 eV and greater than 2 eV. Preferably, the electrically conductive layer is formed from a conductive n-type oxide. Suitable materials include $SnO_x$; $ZnO_x$; $(Zn:Sn)O_x$; $TiO_x$ and $InO_x$, most preferably $SnO_2$, ZnO, $In_2O_3$ and $TiO_2$.

The most preferred material for the electrically conductive layer is $SnO_2$. The layer of a conductive material (7) between the two inorganic electrically insulative layers preferably has a thickness of between 3 and 12 nm.

Band gaps are measured using UV-VIS spectroscopy using methods well known in the art.

When the band gap is wider than, for instance, a glass substrate, ellipsometry (that extends sufficiently into the UV) can be used for more accurate determination of the parameter k. The band gap can then be determined from a Tauc plot generated from the k dispersion.

Band gaps can be measured as indicated in section 3 of the paper by Vos et al, Journal of Vacuum Science & Technology A34, 01A103 (2016).

A light transmissive electrically conductive layer (9) is then deposited on top of the n-type electron transporting layer to form a light receiving top surface. This layer typically comprises a sputtered transparent conducting oxide such as an ITO layer 10 to 200 nm in thickness, but other oxides or materials such as metal nanowires could be used alternatively or in addition. The thickness chosen is a compromise between transparency and electrical conductivity.

The invention is now illustrated by the following Examples.

EXAMPLES

The results presented herein are for a PIN photovoltaic device with an inorganic "intrinsic-n-type-intrinsic (INI)" sandwich interfacial structure as shown in FIG. 1B, wherein the INI structure is specifically $Al_2O_3/SnO_2/Al_2O_3$.

The $Al_2O_3$ layers are 1 nm thick and the $SnO_2$ layer is 6 nm thick comprising $SnO_2$ also deposited by ALD.

For thermal ALD of $Al_2O_3$, substrates are held at 80-120° C. TMA and $H_2O$ are held in separate stainless steel containers at room temperature, and the ALD sequence is TMA-dose/TMA-purge/$H_2O$-dose/$H_2O$ purge.

For thermal ALD of $SnO_x$, substrates are held at 80-120° C. TDMASn and $H_2O$ are held in separate stainless steel containers at 60° C. and room temperature respectively, and the ALD sequence is TDMASn-dose/TDMASn-purge/$H_2O$-dose/$H_2O$ purge.

Growth-per-cycle for $Al_2O_3$ and $SnO_2$ layers is 0.1-0.12 nm and 0.12-0.14 nm respectively, and cycle number is chosen appropriately to generate the desired thicknesses.

The entire stack is deposited by thermal ALD to ensure thickness control and film completion for each constituent of the stack. $H_2O$ is used as the co-reactant for both $SnO_2$ and $Al_2O_3$ processes. TDMASn and TMA are used as respective metal precursors. A series of experiments were then carried out on the stack of the invention and a stack corresponding to the prior art, which comprised a $SnO_2$ layer in the place of the trilayer. The stacks were otherwise identical.

Example 1: Measured Thickness

Figure 2:
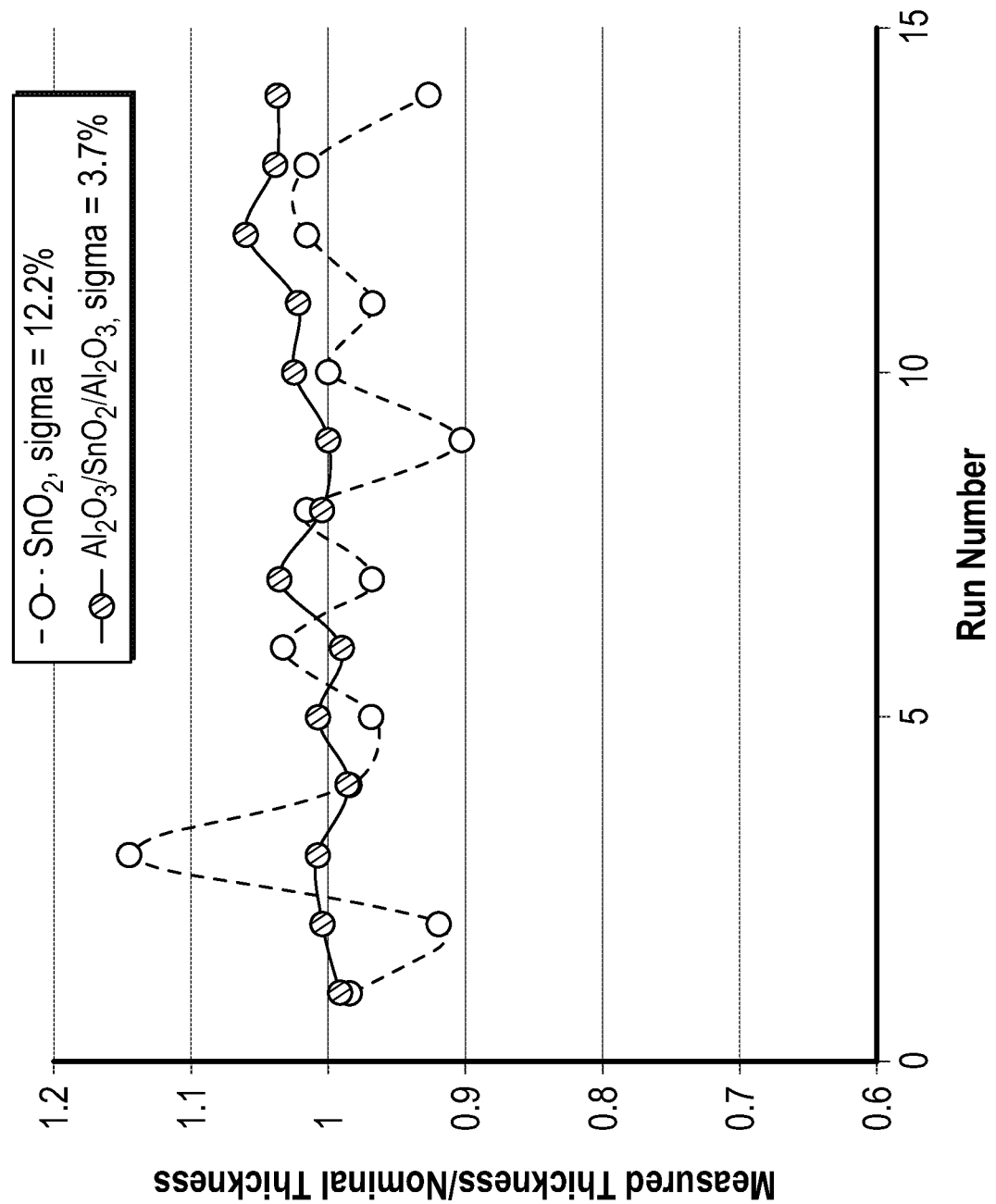
FIG. 2 is a plot of the measured thickness normalised to the expected thickness for repeated runs of: a) $SnO_2$ only; and b) $Al_2O_3/SnO_2/Al_2O_3$.

FIG. 2 is a plot of the measured thickness normalised to the expected thickness for repeated runs of: a) $SnO_2$ only; and b) $Al_2O_3/SnO_2/Al_2O_3$ demonstrating the reduced run-to-run variability achieved with the tri-layer as compared to the single layer. This is attributed to the first $Al_2O_3$ layer acting to promote nucleation of the $SnO_2$ layer.

The thickness was measured using spectroscopic ellipsometry from a Si witness sample, included in deposition runs of perovskite devices. The thickness measured is relative to nominal thickness, which is set by the number of ALD cycles used. A Woollam M2000 ellipsometer was used to measure the thicknesses. A general-oscillator model, consisting of a single Tauc-Lorentz oscillator, was used to describe the complex dielectric function and thereby fit the raw psi-delta dispersion data. The extracted fitting parameters from the Tauc-Lorentz oscillator construct an n and k dispersion. Following the data fitting, n @ 632 nm lies between 1.8-1.85.

Example 2: Series Resistance, Ideality Factor and Reverse Saturation Current Current-voltage (1-V) curves were constructed and demonstrated improved diode parameters when using the inventive structure. A Keithley source meter was used to carry out the measurements. Initially, J-V curves were produced with were fit with a single diode solar cell equivalent circuit to extract n (ideality factor), Jo (reverse saturation current), and $R_s$ (series resistance). The $V_{oc}$, FF, etc. were obtained from AM1.5 illuminated J-V measurements.

FIG. 3 is a table listing the best values and associated range (from 20 single-junction perovskite devices for each device type) of series resistance, ideality factor and reverse saturation current, as extracted by fitting a one diode model to the dark current-voltage data. The gains in $V_{oc}$ and FF obtained by using the tri-layer in place of $SnO_2$-only, as measured from light current-voltage data, are also shown.

Device parameters listed in FIG. 3—including both the ideality factor (n) and saturation current (Jo) are reduced by the inclusion of the INI structure, indicating reduced recombination. Open circuit voltage and FF is enhanced. When log plots of dark I-V curves were constructed, they showed a reduction in parasitic shunt currents.

Example 3: Shunt Resistance

In this experiment, the importance of the thickness of the first $Al_2O_3$ layer is demonstrated, having been varied from 0-2 nm. Light I-V measurements were obtained using a Keithley source meter and AM1.5 illumination. The shunt resistance was taken from the inverse of the J-V gradient at short circuit.

Figure 4:
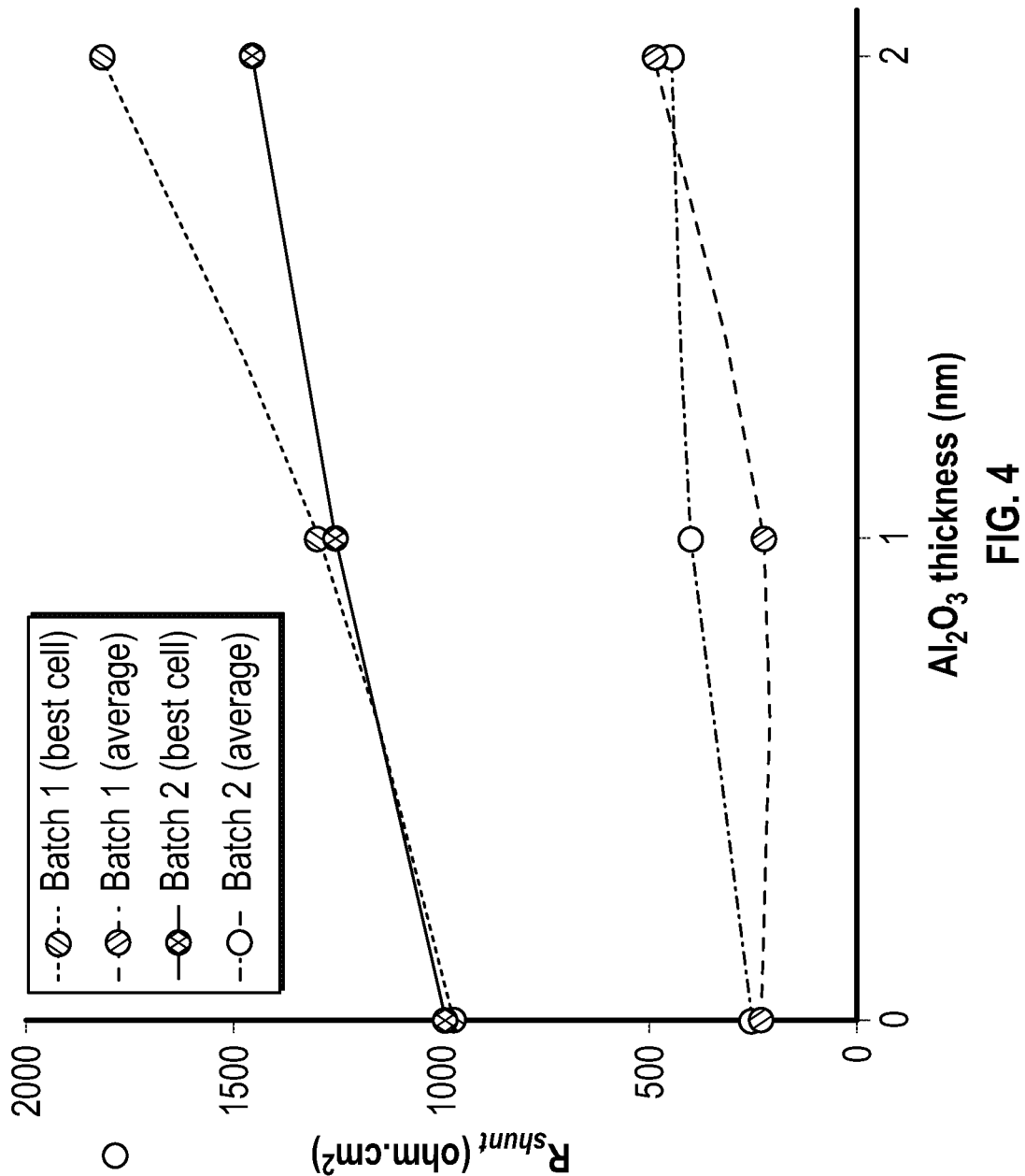
FIG. 4 shows the shunt resistance, $R_{shunt}$, of perovskite/Si tandem solar cells as a function of the thickness, x, of the first $Al_2O_3$ layer within an ALD tri-layer: x nm-$Al_2O_3$/$SnO_2$/1 nm-$Al_2O_3$. The plot is shown for the best cell and the average of 20 devices for each thickness.

FIG. 4 shows the shunt resistance $R_{shunt}$, of perovskite/Si tandem solar cells as a function of the thickness, x, of the first $Al_2O_3$ layer within an ALD tri-layer: x nm-$Al_2O_3$/ $SnO_2$/1 nm-$Al_2O_3$.

The experiments were carried out for two different bottom cell wafer types, onto which inverted perovskite top cells were deposited. Device efficiency, fill factor and shunt resistance all increase with $Al_2O_3$ thickness.

The plot in FIG. 4 is shown for the best cell and the average of 20 devices for each thickness. This experiment was carried out twice, and the results of both batches are shown, demonstrating a consistent positive trend—in particular for the best performing devices.

The invention claimed is:

1. A photovoltaic device comprising a PIN structure in which a p-type hole transporting layer is carried by a substrate and a perovskite layer and an n-type electron transporting layer are arranged in sequence on the p-type layer, and a light transmissive electrically conductive layer provided on top of the n-type electron transporting layer to form a light receiving top surface, characterised in that between the n-type electron transporting layer and the light transmissive conductive layer there is provided an interfacial structure comprising two inorganic electrically insulative layers having a layer of a conductive material therebetween, wherein each of the two inorganic electrically insulative layers comprise a material having a band gap of greater than 4.5 eV and the layer of a conductive material comprises a material having a band gap of less than the band gap of each of the two electrically insulative layers, wherein each electrically insulative layer forms a type-1 offset junction with the layer of conductive material.

2. The photovoltaic device according to claim 1 wherein the layer of conductive material comprises a material having a band gap of less than or equal to 4.0 eV and greater than 2 eV.

3. The photovoltaic device as claimed in claim 1 in which the substrate comprises a further photovoltaic sub-cell to form a monolithically integrated multi-junction photovoltaic device.

4. The photovoltaic device as claimed in claim 1 in which each of the two inorganic electrically insulative layers comprise $Al_2O_3$.

5. The photovoltaic device as claimed in claim 1 in which the layer of a conductive material between the two inorganic electrically insulative layers comprises one or more of the materials selected from the group consisting of: $SnO_x$; $ZnO_x$; $(Zn:Sn)O_x$; $TiO_x$ and $InO_x$.

6. The photovoltaic device as claimed in claim 5 in which the layer of a conductive material between the two inorganic electrically insulative layers comprises $SnO_x$.

7. The photovoltaic device as claimed in claim 3 in which the further photovoltaic sub-cell comprises a perovskite, monocrystalline silicon, polysilicon, Cu (In,Ga)$Se_2$ or $Cu_2ZnSn$ (S,Se)$_4$ sub-cell.

8. The photovoltaic device as claimed in claim 1 in which the perovskite layer comprises one or more cations selected from organic cations and caesium cations, one or more of Pb, Sn, Sb or Ti, and one or more halide anions selected from Cl, Br and I.

9. The photovoltaic device as claimed in claim 1 in which each of the two inorganic electrically insulative layers have a thickness of between 0.4 and 3 nm.

10. The photovoltaic device as claimed in claim 1 in which the layer of a conductive material between the two inorganic electrically insulative layers has a thickness of between 3 and 12 nm.

11. A method of making a photovoltaic device as claimed in claim 1 in which the two inorganic electrically insulative layers and the layer of conductive material therebetween are deposited in sequence onto the layer of n-type electron transporting material by atomic layer deposition.

12. The method as claimed in claim 11 in which the atomic layer deposition is performed at a temperature of less than or equal to 125° C.

13. A photovoltaic device according to claim 1, wherein the n-type electron transporting layer is an organic n-type material.

* * * * *